United States Patent
Shirasaki (10) Patent No.: US 12,393,067 B2
(45) Date of Patent: Aug. 19, 2025

(54) DRIVER CIRCUIT FOR SUPPRESSING VARIATIONS IN SLEW RATE

(71) Applicant: LAPIS Technology Co., Ltd., Yokohama (JP)

(72) Inventor: Hijiri Shirasaki, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 18/592,525

(22) Filed: Mar. 1, 2024

(65) Prior Publication Data
US 2024/0295764 A1 Sep. 5, 2024

(30) Foreign Application Priority Data
Mar. 3, 2023 (JP) .................................. 2023-033214

(51) Int. Cl.
G09G 3/36 (2006.01)
G02F 1/133 (2006.01)
H03K 17/687 (2006.01)

(52) U.S. Cl.
CPC ....... *G02F 1/13306* (2013.01); *G09G 3/3648* (2013.01); *H03K 17/687* (2013.01); *G09G 2310/0291* (2013.01); *G09G 2320/0233* (2013.01); *G09G 2320/041* (2013.01)

(58) Field of Classification Search
CPC .............. G02F 1/13306; G09G 3/3648; G09G 2310/0291; G09G 2320/0233; G09G 2320/041; H03K 17/687
See application file for complete search history.

(56) References Cited

U.S. PATENT DOCUMENTS

| | | | |
|---|---|---|---|
| 7,474,857 B2* | 1/2009 | Grace | H04B 10/1141 398/106 |
| 9,275,595 B2* | 3/2016 | Kim | H03K 5/04 |
| 9,730,291 B1* | 8/2017 | Janik | H05B 45/20 |
| 10,772,175 B1* | 9/2020 | Liu | H05B 45/3577 |
| 11,804,836 B1* | 10/2023 | Kapusta | H03K 17/04123 |
| 2002/0105452 A1* | 8/2002 | Clapp | H03M 1/108 341/144 |
| 2014/0253534 A1* | 9/2014 | Kim | G09G 3/3688 345/99 |
| 2015/0084694 A1* | 3/2015 | Lee | H03F 1/483 327/170 |

(Continued)

FOREIGN PATENT DOCUMENTS

JP 2012137571 7/2012

*Primary Examiner* — Sejoon Ahn
(74) *Attorney, Agent, or Firm* — JCIPRNET (57) ABSTRACT

In a driver circuit, a bias voltage generation circuit generates and outputs a bias voltage for determining a bias current of an output amplifier. A memory stores a trimming code with which a slew rate of an output voltage outputted by the output amplifier is adjusted to fall within a target range set in advance. In an adjustment mode for adjusting the slew rate, a slew rate adjustment circuit adjusts the slew rate of the output amplifier based on a trimming code inputted from a shipping inspection device. Then, in a normal operation mode, the slew rate adjustment circuit changes a resistance value based on the trimming code stored in the memory to change a bias level of the bias voltage generation circuit and adjust the slew rate of the output amplifier.

3 Claims, 14 Drawing Sheets

(56) References Cited

U.S. PATENT DOCUMENTS

| | | | |
|---|---|---|---|
| 2015/0222252 A1* | 8/2015 | Kim | H03F 3/45771 |
| | | | 327/307 |
| 2017/0188420 A1* | 6/2017 | Kido | H05B 47/24 |
| 2019/0167235 A1* | 6/2019 | Freeman | G01S 15/8915 |
| 2020/0182989 A1* | 6/2020 | Freeman | G01S 7/5202 |
| 2022/0199876 A1* | 6/2022 | Choi | H10H 29/142 |
| 2023/0268918 A1* | 8/2023 | Hayashi | H02M 1/0029 |
| | | | 327/427 |
| 2023/0335040 A1* | 10/2023 | Yu | G09G 3/3696 |

\* cited by examiner

DRIVER CIRCUIT FOR SUPPRESSING VARIATIONS IN SLEW RATE

CROSS-REFERENCE TO RELATED APPLICATION

This application claims the priority benefit of Japan application serial no. 2023-033214, filed on Mar. 3, 2023. The entirety of the above-mentioned patent application is hereby incorporated by reference herein and made a part of this specification.

BACKGROUND

Technical Field

The disclosure relates to a driver circuit.

Related Art

In recent years, with the increase in the resolution of liquid crystal display panels used for display, a liquid crystal display panel is generally divided and driven in block units by a plurality of driver ICs arranged in a cascade configuration.

Thus, there is an increasing demand for a higher write speed for liquid crystal display panels, and the write time to the liquid crystal display panels is becoming shorter. Consequently, if the variation in the slew rate of an output amplifier becomes large among the plurality of driver ICs, a brightness difference may occur among the blocks of the liquid crystal display panel, and the display quality may deteriorate.

As a method for increasing the slew rate of the output amplifier of the driver IC, for example, Patent Document 1 (Japanese Patent Application Laid-Open No. 2012-137571) discloses a method of increasing the slew rate by increasing the bias current.

However, as the bias current of the output amplifier of the driver IC increases, power consumption of the driver IC increases, and there is an issue of heat generation. Thus, if the slew rate is increased by uniformly increasing the bias current of the plurality of driver ICs, it becomes difficult to drive a liquid crystal display panel using many driver ICs.

SUMMARY

A driver circuit according to an embodiment of the disclosure includes an output amplifier, a bias setting circuit, a memory, and an adjustment circuit. The output amplifier outputs an output signal for driving a liquid crystal display panel. The bias setting circuit sets a bias level of the output amplifier. The memory stores a trimming code with which a slew rate of the output signal outputted by the output amplifier is adjusted to fall within a target range set in advance. In a normal operation mode, the adjustment circuit changes a resistance value based on the trimming code stored in the memory to change the bias level of the bias setting circuit and adjust the slew rate of the output amplifier.

Further, another driver circuit according to an embodiment of the disclosure includes an output amplifier, a bias setting circuit, an adjustment circuit, and an automatic setting circuit. The output amplifier outputs an output signal for driving a liquid crystal display panel. The bias setting circuit sets a bias level of the output amplifier. The adjustment circuit changes a resistance value based on an inputted trimming code to change the bias level of the bias setting circuit and adjust a slew rate of the output amplifier. In an adjustment mode, the automatic setting circuit sequentially changes the trimming code outputted to the adjustment circuit and stores a trimming code with which a voltage value of the output signal after a preset time has elapsed from input of an input signal to the output amplifier becomes a target voltage set in advance, and, in a normal operation mode, the automatic setting circuit outputs the stored trimming code to the adjustment circuit.

DESCRIPTION OF EMBODIMENTS

Embodiments of the disclosure provide a driver circuit capable of suppressing variations in the slew rate among a plurality of driver circuits to a specific range without uniformly increasing the bias current to increase the slew rate.

Next, embodiments of the disclosure will be described in detail with reference to the drawings.

Figure 1:
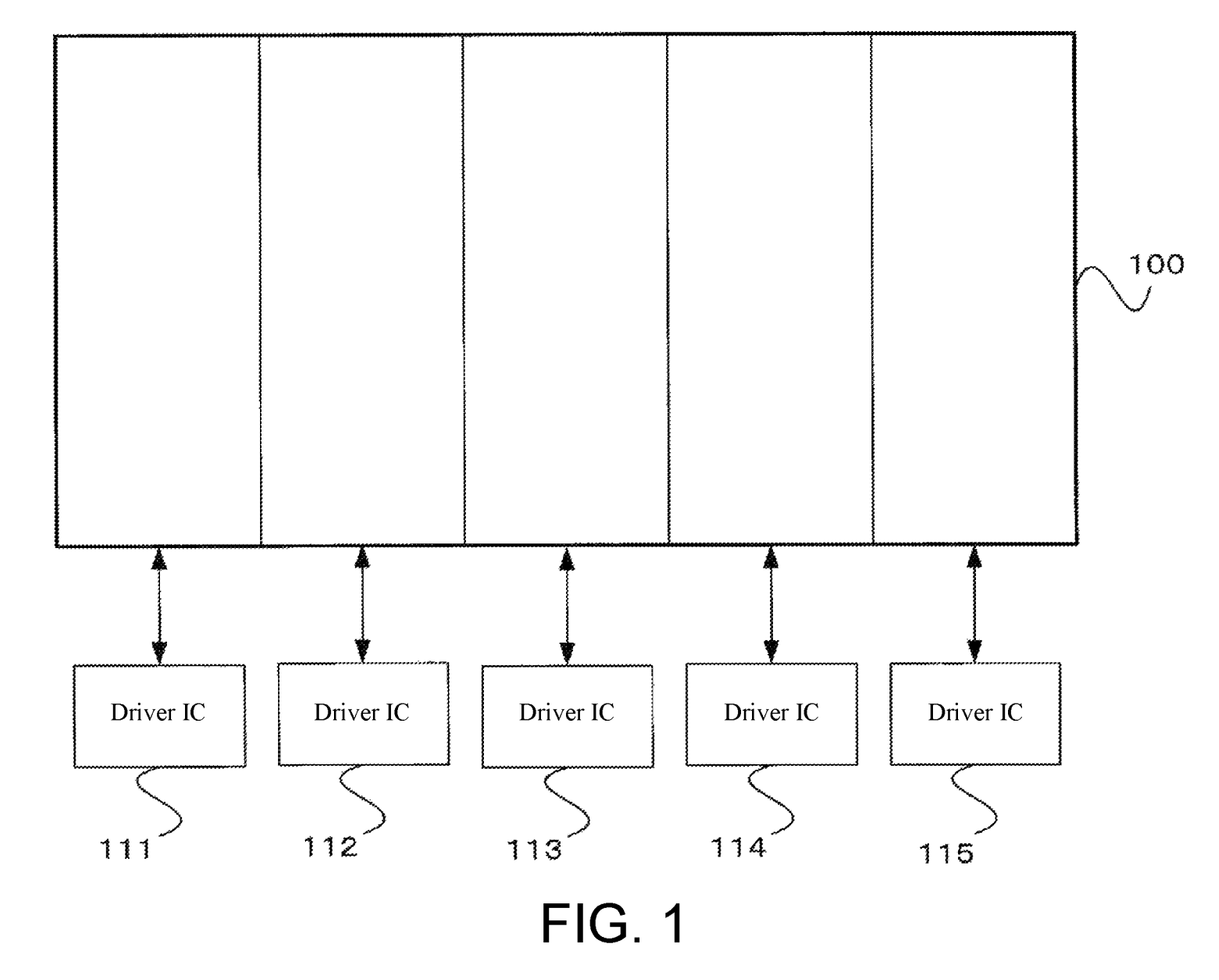
FIG. 1 is a view showing a liquid crystal display panel 100 divided into blocks respectively driven by five driver ICs 111 to 115 arranged in cascade.

First, before illustrating a driver IC (driver circuit) of this embodiment, FIG. 1 shows driving of a liquid crystal display panel using a plurality of driver ICs.

FIG. 1 shows that a liquid crystal display panel 100 is divided into blocks, and the blocks are respectively driven by five driver ICs 111 to 115 arranged in a cascade.

In the case of performing write of an image to a liquid crystal display panel from such driver ICs, the write period for performing the write is controlled according to a write timing signal. Specifically, it is required to perform write from the driver IC to the liquid crystal display panel during the write period in which the write timing signal is at the low level (hereinafter abbreviated as an L level). Then, the output voltage of the driver IC at the end of the write period will be written to the liquid crystal display panel.

Figure 2:
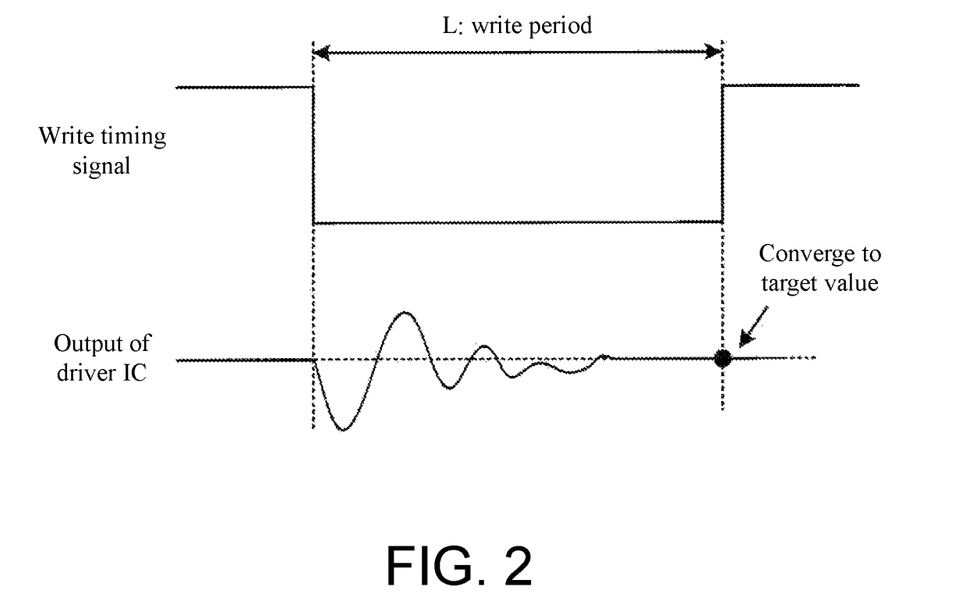
FIG. 2 is a diagram for illustrating execution of write to the liquid crystal display panel by the driver IC in the case where the write period is sufficiently long.

Herein, in the case where the write period is sufficiently long, as shown in FIG. 2, the output voltage of the driver IC converges to a target value intended to be written, so the write to the liquid crystal display panel is performed based on the voltage serving as the target value.

Figure 3:
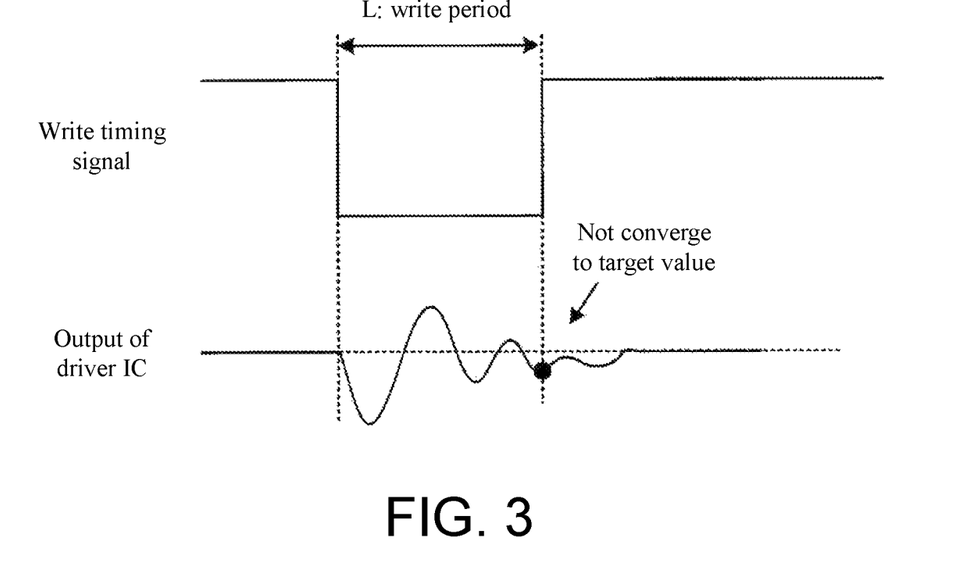
FIG. 3 is a diagram for illustrating execution of write to the liquid crystal display panel by the driver IC in the case where the write period is short.

However, as the write speed of the liquid crystal display panel increases, this write period becomes shorter. As the write period becomes shorter, as shown in FIG. 3, there may be cases where the write period ends before the output voltage of the driver IC converges to the target value. As a result, the write to the liquid crystal display panel will be performed based on a voltage different from the voltage serving as the target voltage.

In addition, slew rates of a plurality of driver ICs differ from each other due to manufacturing variations or the like. As the variation in the slew rate among the plurality of driver ICs becomes large, there may be problems with the image displayed on the liquid crystal display panel.

Figure 4:
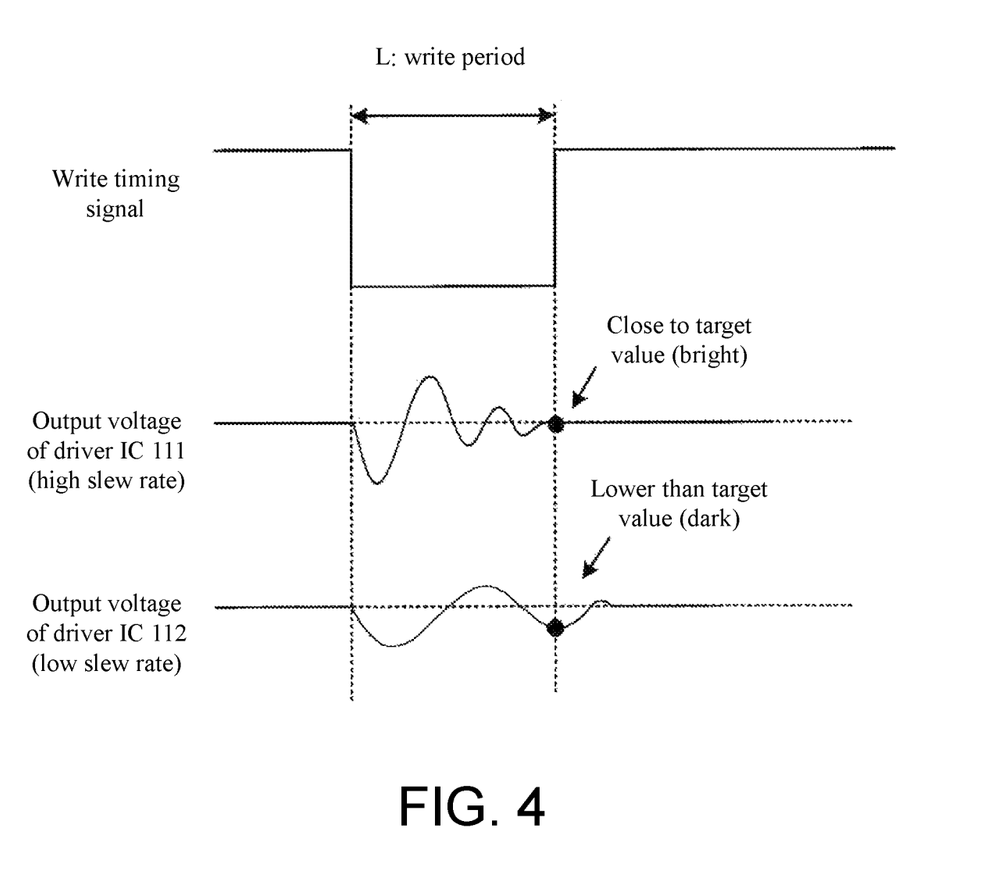
FIG. 4 is a diagram for illustrating execution of write to the liquid crystal display panel by two driver ICs 111 and 112 with slew rates different from each other.

For example, as shown in FIG. 4, a case where the slew rate of the driver IC 111 is high and the slew rate of the driver IC 112 is low will be illustrated.

Due to the difference in the slew rate of the driver IC 111 and the slew rate of the driver IC 112, a difference occurs in the rise of the output voltage, and a difference also occurs in the time for reaching convergence of the output voltage to the voltage serving as the target voltage. As a result, as shown in FIG. 4, when the write period is short, even if the target value of the output voltage is the same, the voltage value at the end of the write period will be different from each other.

Figure 5:
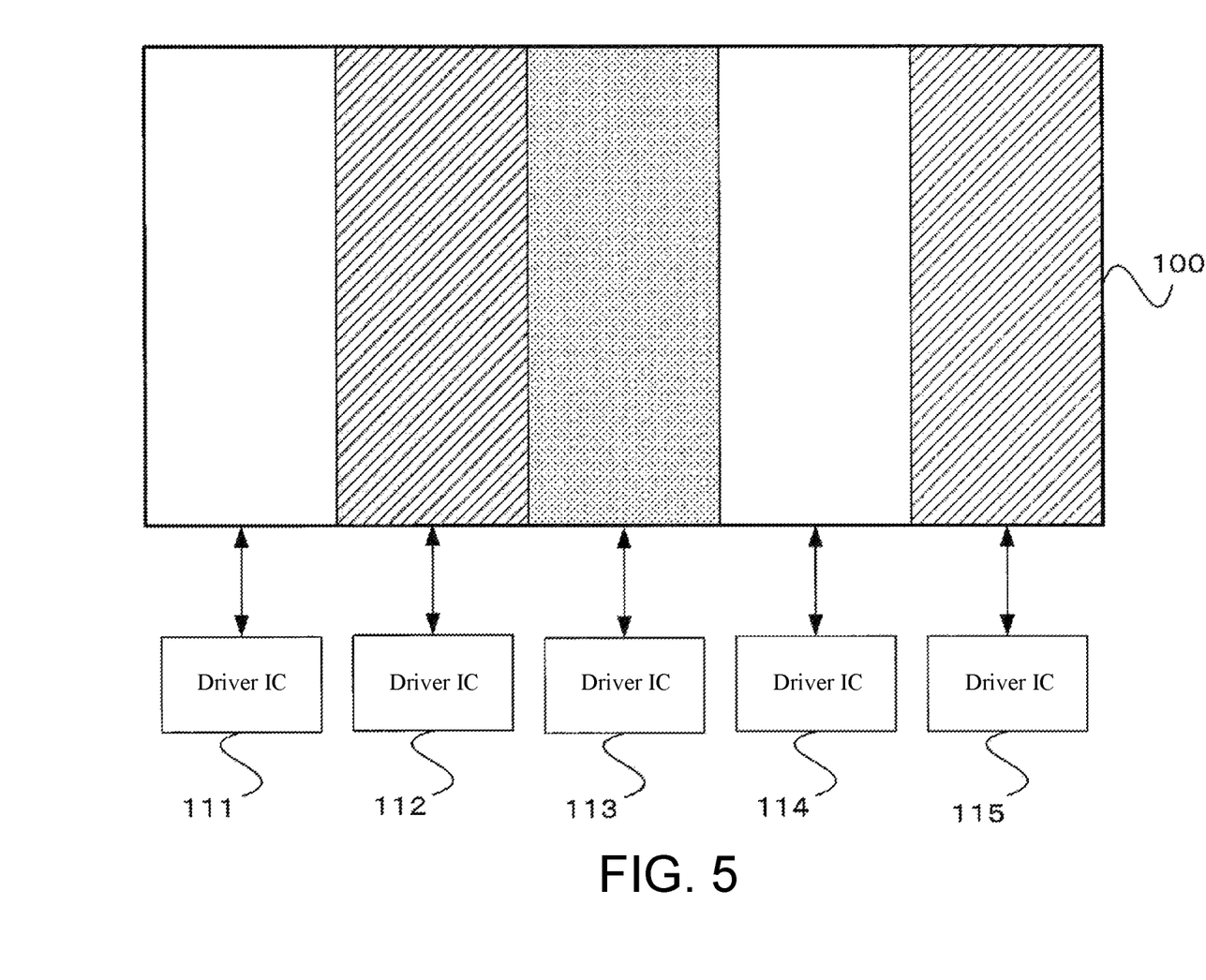
FIG. 5 is a diagram for illustrating occurrence of brightness differences among blocks in the case of driving the liquid crystal display panel 100 by blocks using the plurality of driver ICs 111 to 115.

As a result, as shown in FIG. 5, in the case of driving the liquid crystal display panel 100 block by block using the plurality of driver ICs 111 to 115, even if an attempt is made to display all blocks with the same brightness, a brightness difference occurs among the blocks and the display quality deteriorates.

First Embodiment

Figure 6:
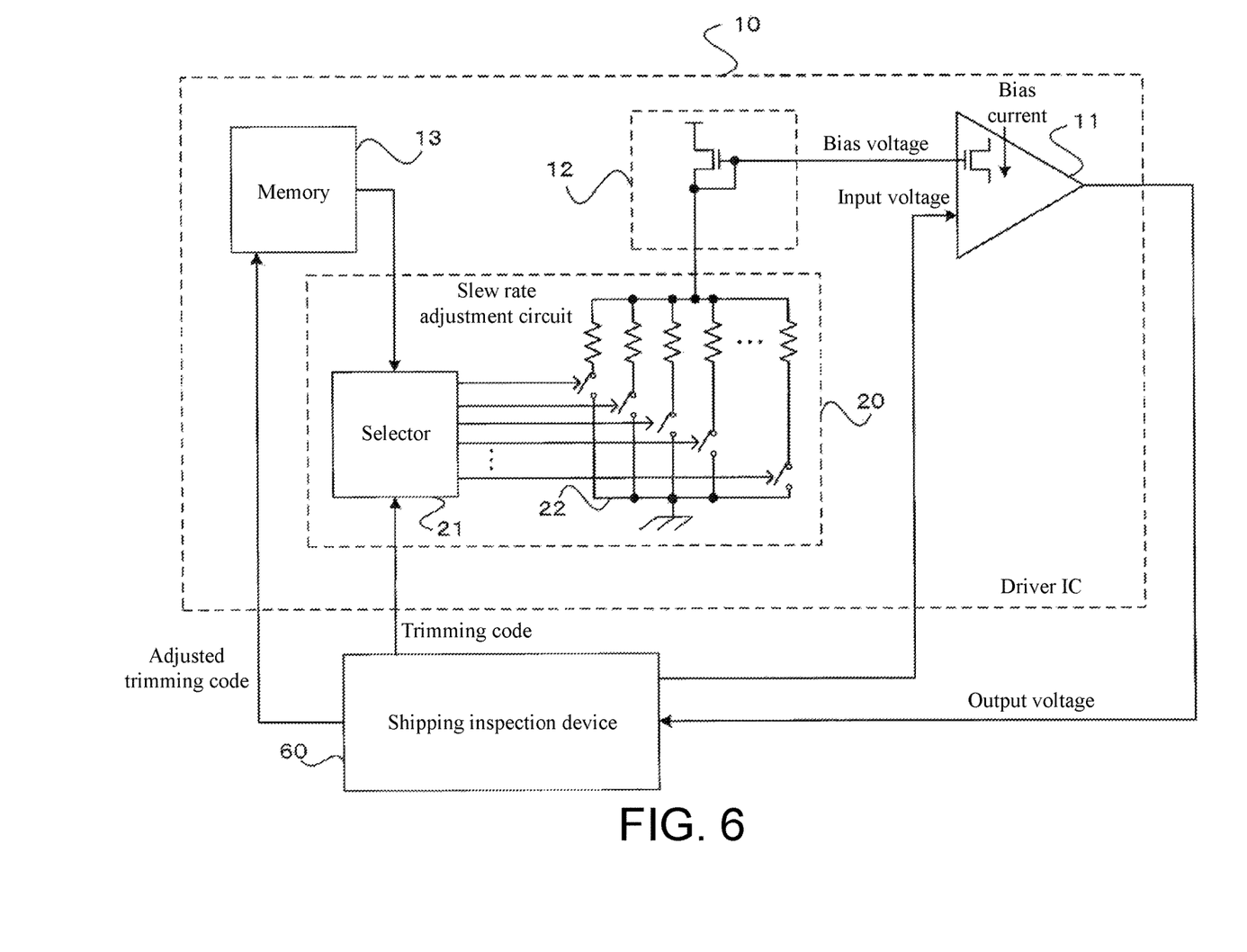
FIG. 6 is a block diagram of a driver IC 10 according to a first embodiment of the disclosure.

Next, a block diagram of a driver IC 10 according to a first embodiment of the disclosure is shown in FIG. 6.

As shown in FIG. 6, the driver IC 10 of this embodiment includes an output amplifier 11 that outputs an output signal for driving a liquid crystal display panel, a bias voltage generation circuit 12, a memory 13, and a slew rate adjustment circuit 20.

The bias voltage generation circuit 12 functions as a bias setting circuit that sets the bias level of the output amplifier 11. Specifically, the bias voltage generation circuit 12 generates and outputs a bias voltage for determining the bias current of the output amplifier 11. The bias current of the output amplifier 11 is determined based on the bias voltage from the bias voltage generation circuit 12.

The memory 13 is composed of a non-volatile memory element such as a fuse element or an erasable programmable read only memory (EPROM). The memory 13 stores a trimming code with which the slew rate of the output voltage outputted by the output amplifier 11 is adjusted to fall within a target range set in advance.

In this embodiment, the slew rate of the driver IC 10 is adjusted by a shipping inspection device 60 during shipping inspection of the driver IC 10.

In an adjustment mode for adjusting the slew rate, the slew rate adjustment circuit 20 adjusts the slew rate of the output amplifier 11 based on the trimming code received from the shipping inspection device 60 outside the driver IC 10.

In a normal operation mode, the slew rate adjustment circuit 20 changes the resistance value based on the trimming code stored in the memory 13 to thereby change the bias voltage of the bias voltage generation circuit 12 and adjust the slew rate of the output amplifier 11.

The slew rate adjustment circuit 20 is composed of a selector 21 and a variable resistance circuit 22.

The variable resistance circuit 22 is composed of, for example, a plurality of resistor elements and a plurality of switch elements. The plurality of resistor elements have resistance values different from each other and each have one terminal connected to the bias voltage generation circuit 12. The plurality of switch elements are connected between the other terminals of the plurality of resistor elements and ground. The variable resistance circuit 22 is configured to turn on any of the plurality of switch elements based on a selection signal from the selector 21.

The selector 21 is configured to control on or off of each of the plurality of switch elements in the variable resistance circuit 22 by switching the selection signal outputted to the variable resistance circuit 22. In the adjustment mode, the selector 21 switches the selection signal outputted to the variable resistance circuit 22 based on the trimming code from the shipping inspection device 60. Further, in the normal operation mode, the selector 21 switches the selection signal outputted to the variable resistance circuit 22 based on the trimming code read from the memory 13.

The variable resistance circuit 22 is connected between the drain terminal of the FET in the bias voltage generation circuit 12 and ground. Thus, the bias voltage generated by the bias voltage generation circuit 12 also changes due to changes in the resistance value of the variable resistance circuit 22.

Next, an operation when adjusting the slew rate of the driver IC 10 by the shipping inspection device 60 during shipping inspection of the driver IC 10 will be described.

Figure 7:
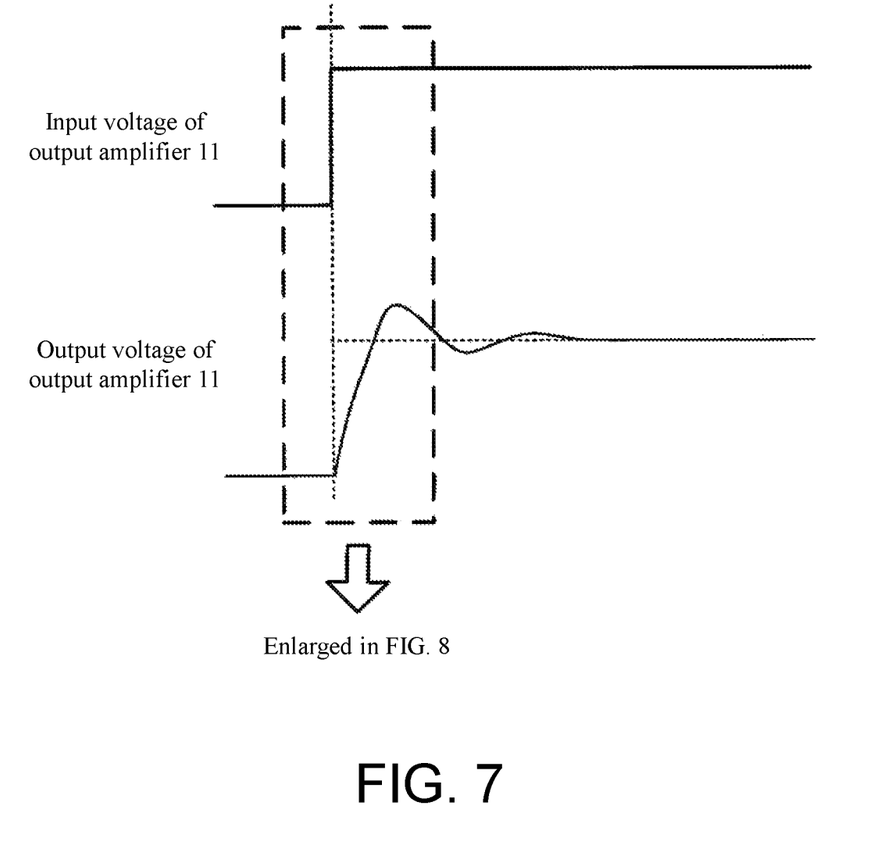
FIG. 7 is a diagram showing an example of an output waveform during slew rate adjustment.

First, the shipping inspection device 60 inputs an input waveform as shown in FIG. 7 as an input voltage of the output amplifier 11. Then, as shown in FIG. 7, the output amplifier 11 outputs an output voltage with a waveform changed according to the slew rate of the output amplifier 11.

Figure 8:
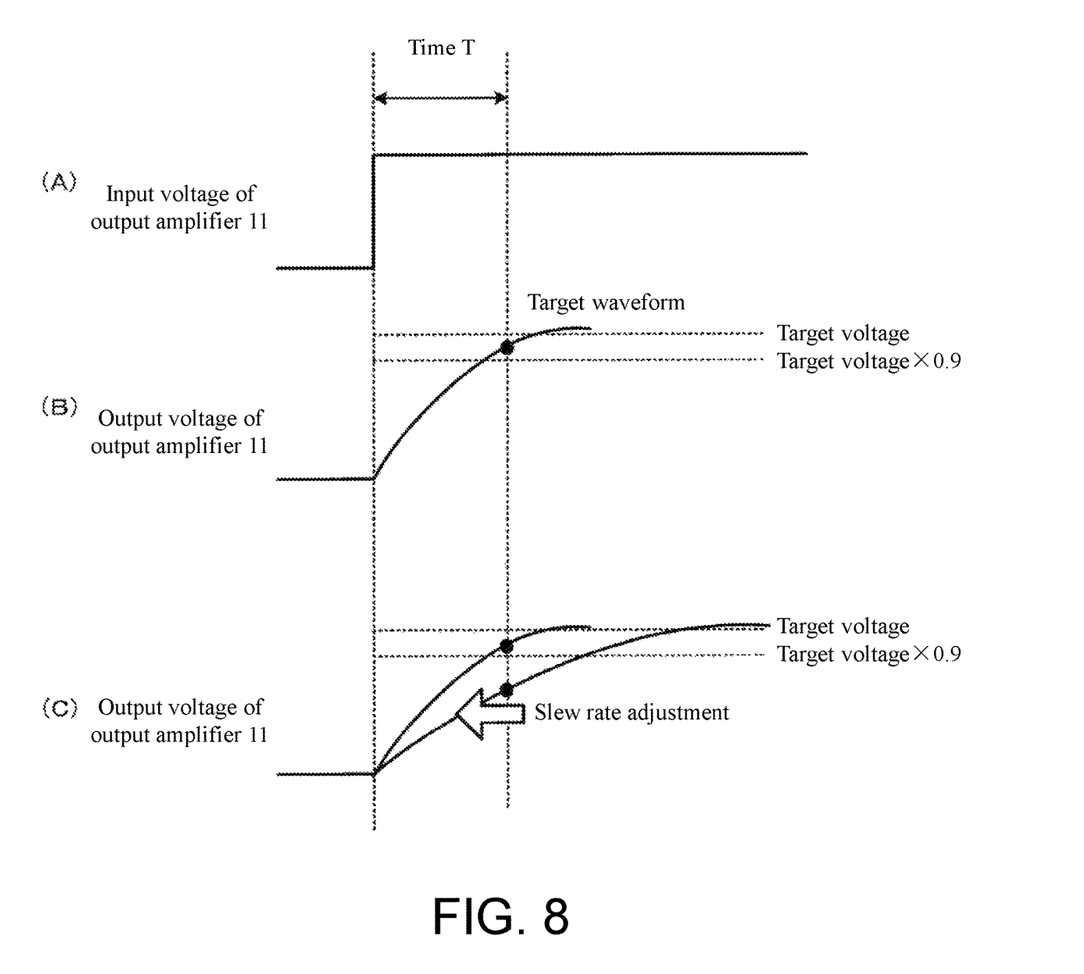
FIG. 8 is an enlarged view around a rise time of an input voltage in FIG. 7.

FIG. 8 shows an enlarged view around the rise time of this input voltage in FIG. 7.

(A) of FIG. 8 shows the waveform of the input voltage of the output amplifier 11. Herein, when adjusting the slew rate, the target waveform of the output voltage serving as the target is shown in (B) of FIG. 8 and slew rate adjustment is performed. Specifically, a waveform in which the voltage after time T has elapsed from the rise of the input voltage converges within a range set in advance, for example, within a range from 0.9 times the target voltage to the target voltage, is set as the target waveform.

Herein, it is assumed that the waveform of the output voltage of the output amplifier 11 is the waveform as shown in (C) of FIG. 8. In the waveform shown in (C) of FIG. 8, the voltage after time T has elapsed does not converge within the range from 0.9 times the target voltage to the target voltage. Thus, the shipping inspection device 60 changes the trimming code outputted to the selector 21 such that the slew rate increases, and performs slew rate adjustment such that the voltage after time T has elapsed converges within the range from 0.9 times the target voltage to the target voltage.

When such slew rate adjustment is completed, the shipping inspection device 60 writes, to the memory 13, the trimming code of the time when the slew rate has converged within the target range, and ends shipping inspection.

Figure 9:
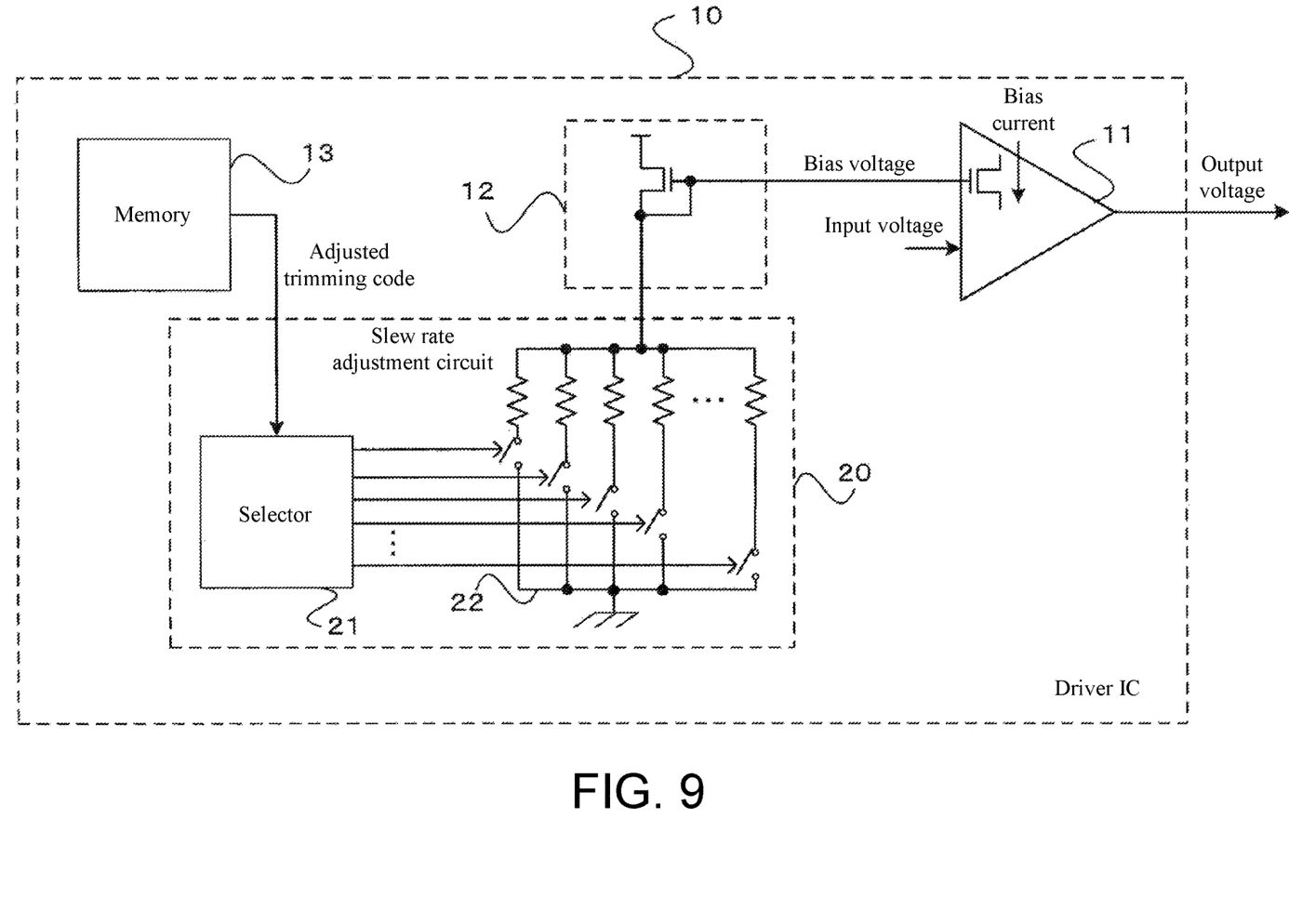
FIG. 9 is a diagram for illustrating an operation of the driver IC 10 after slew rate adjustment.

In the driver IC 10 after shipment, the slew rate of the output amplifier 11 is set based on the trimming code written in the memory 13. Referring to FIG. 9, an operation of the driver IC 10 after slew rate adjustment will be described.

In the driver IC 10 after shipment, as shown in FIG. 9, the selector 21 performs switching of the variable resistance circuit 22 based on the trimming code read from the memory 13. As a result, the slew rate of the output amplifier 11 becomes the slew rate of a predetermined range adjusted at the time of shipping inspection.

By performing slew rate adjustment of each driver IC during shipping inspection of the driver IC in this manner, the variation in the slew rate among all driver ICs to be shipped will be suppressed within a specific range.

Second Embodiment

Figure 10:
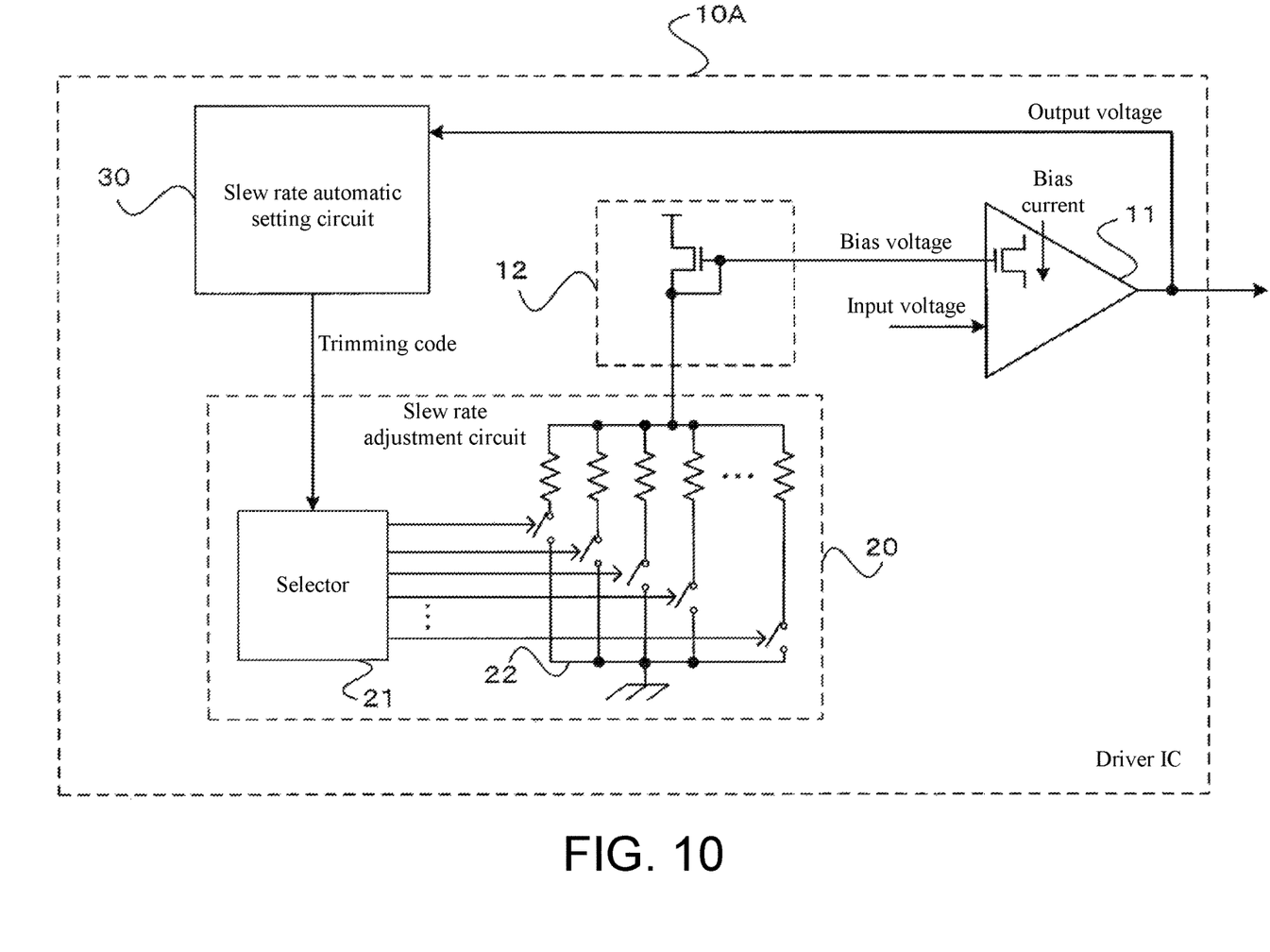
FIG. 10 is a block diagram of a driver IC 10A according to a second embodiment of the disclosure.

Next, a block diagram of a driver IC 10A according to a second embodiment of the disclosure is shown in FIG. 10.

In the driver IC 10 according to the first embodiment described above, the slew rate is adjusted to be within a predetermined range at the time of shipping inspection. However, in the case where the slew rate changes after shipping of the driver IC 10, the slew rate will remain in a changed state.

Thus, the driver IC 10A according to this embodiment is designed to perform slew rate adjustment even in a normal operation condition after shipment.

As shown in FIG. 10, the driver IC 10A according to this embodiment has a configuration in which the memory 13 is replaced with a slew rate automatic setting circuit 30.

In an adjustment mode, the slew rate automatic setting circuit 30 sequentially changes the trimming code outputted to the slew rate adjustment circuit 20, and stores the trimming code with which the voltage value of an output signal after a preset time has elapsed from input of an input signal to the output amplifier 11 becomes a target voltage set in advance. Then, in a normal operation mode, the slew rate automatic setting circuit 30 operates to output the stored trimming code to the slew rate adjustment circuit 20.

Figure 11:
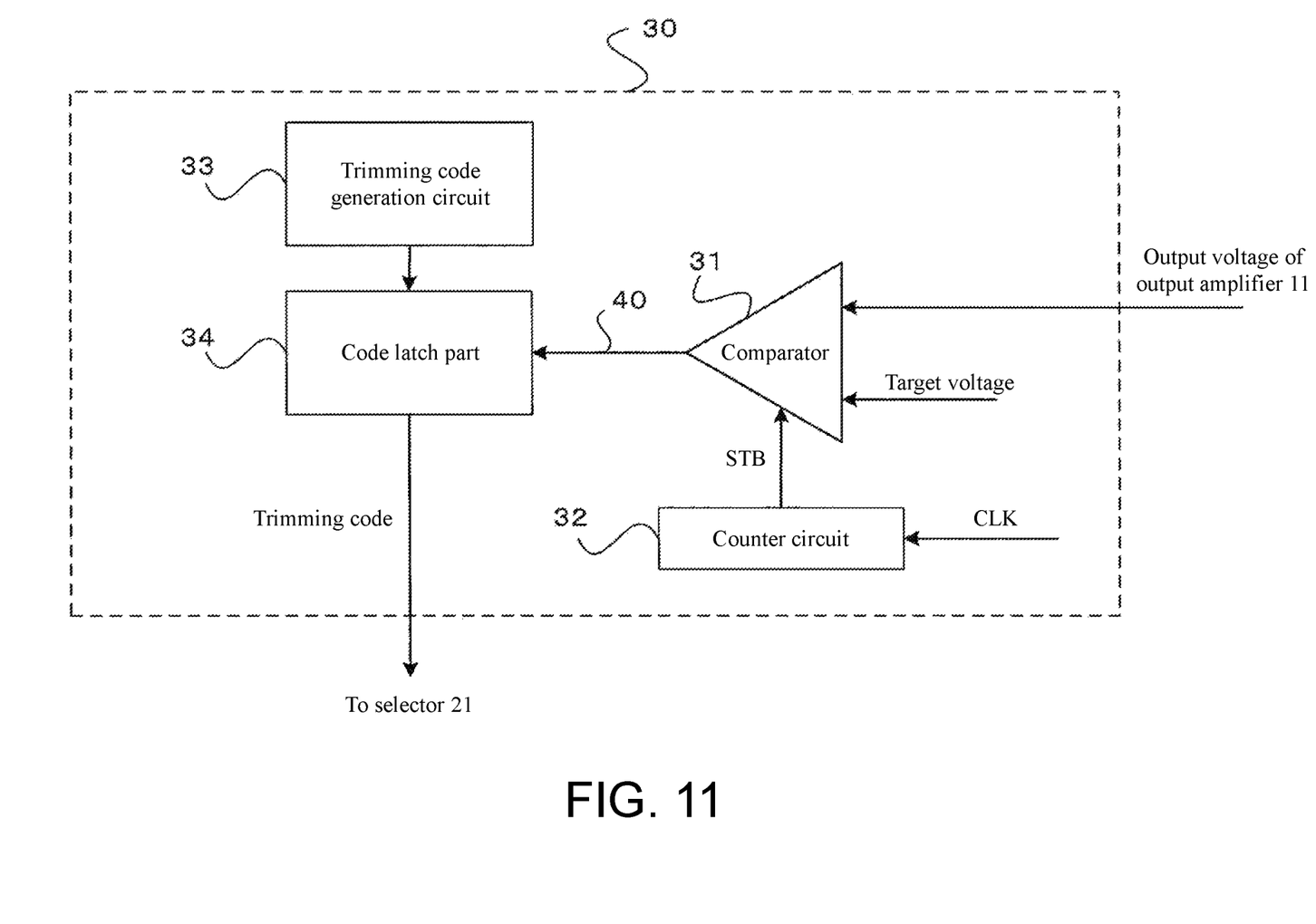
FIG. 11 is a block diagram showing a configuration of a slew rate automatic setting circuit 30 in FIG. 10.

The configuration of the slew rate automatic setting circuit 30 in FIG. 10 is shown in the block diagram of FIG. 11.

As shown in FIG. 11, the slew rate automatic setting circuit 30 includes a comparator 31, a counter circuit 32, a trimming code generation circuit 33, and a code latch part 34.

Upon receiving a clock signal CLK, the counter circuit 32 outputs a standby signal STB after a preset period has elapsed.

The comparator 31 compares the output voltage of the output amplifier 11 with the target voltage. Then, at a time when the comparator 31 receives the standby signal STB from the counter circuit 32, if the output voltage of the output amplifier 11 and the target voltage match, the comparator 31 changes the logic of a latch signal 40 being outputted from the H level to the L level. In other words, the comparator 31 is configured to compare, with the voltage value of the target voltage set in advance, the voltage value of the output signal after a preset time has elapsed from when an input signal is inputted to the output amplifier 11.

In the adjustment mode in which slew rate adjustment is performed, the trimming code generation circuit 33 sequentially changes and generates trimming codes.

In the adjustment mode, the code latch part 34 outputs the trimming code generated by the trimming code generation circuit 33 to the selector 21, and latches the trimming code when the latch signal 40 changes from the H level to the L level.

In other words, the code latch part 34 latches and stores the trimming code of a time when the latch signal 40, which is the output of the comparator 31, becomes the L level indicating that two voltage values have matched. Then, in the normal operation mode, the code latch part 34 outputs the latched trimming code to the selector 21.

The slew rate automatic setting circuit 30 turns into the adjustment mode during a V blank period (vertical blanking interval) in the output signal for driving the liquid crystal display panel, and updates the trimming code stored in the code latch part 34 to a trimming code with which the slew rate falls within the target range set in advance.

Figure 12:
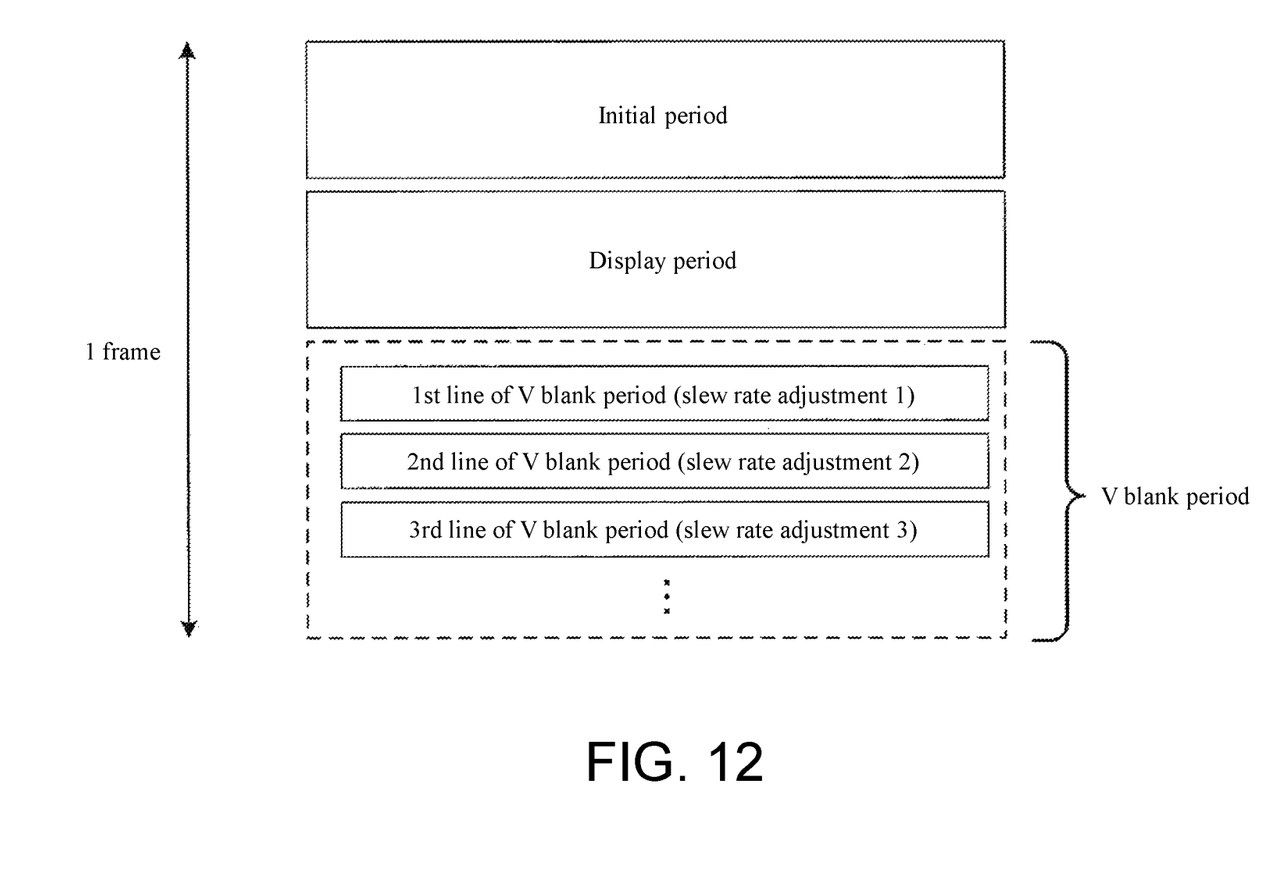
FIG. 12 is a diagram showing a structure of one frame of signal when the driver IC drives display of the liquid crystal display panel.

FIG. 12 shows the structure of one frame of signal when the driver IC drives display of the liquid crystal display panel. The one frame of signal includes an initial period, a display period, and a V blank period.

The slew rate automatic setting circuit 30 performs slew rate adjustment for each line during the V blank period composed of a plurality of lines. Specifically, the slew rate automatic setting circuit 30 changes a trimming code for each line to perform slew rate adjustment, and when the adjusted slew rate is within the predetermined range as the target, the slew rate automatic setting circuit 30 newly holds the trimming code at this time in the code latch part 34.

Figure 13:
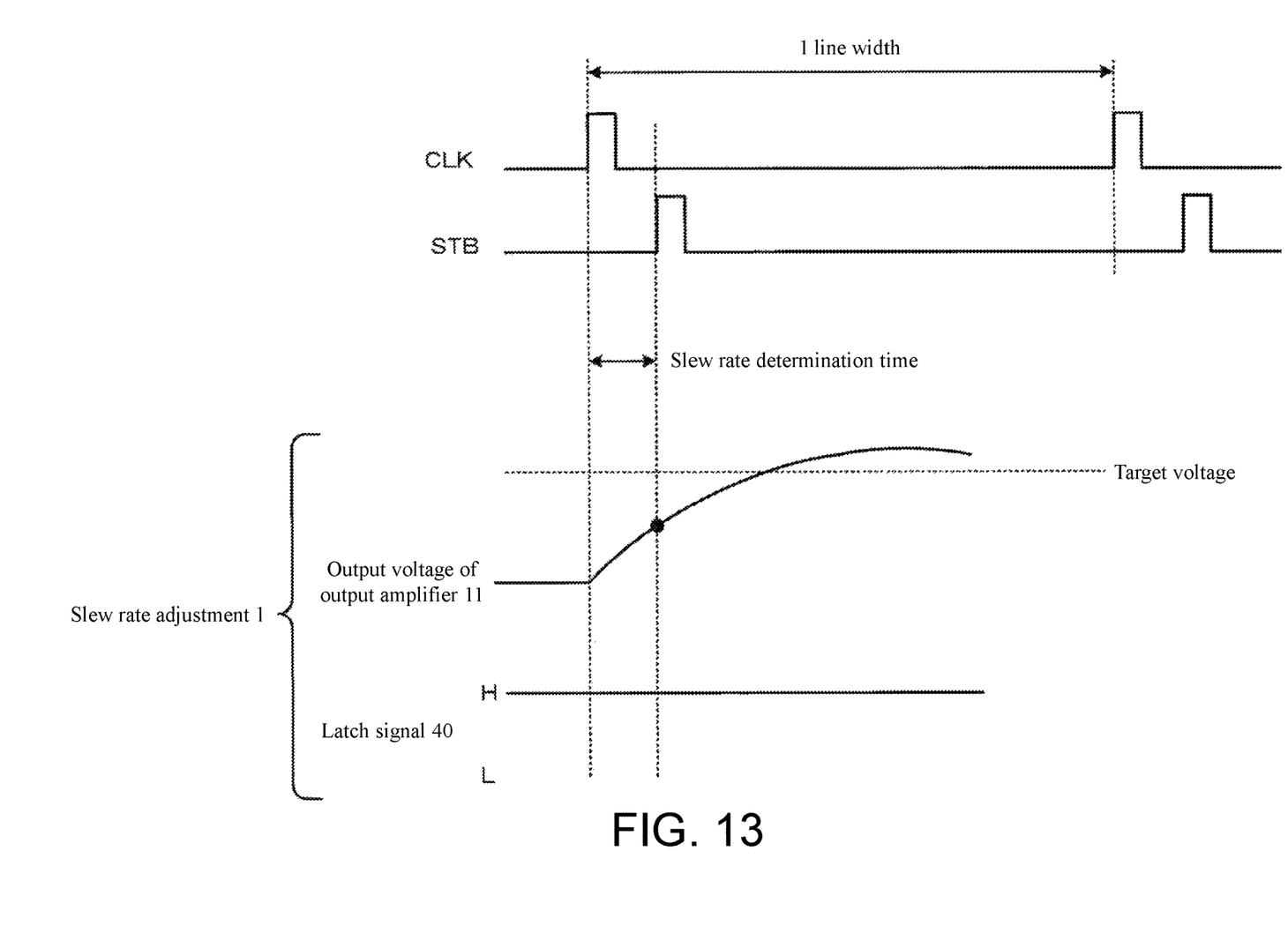
FIG. 13 is a diagram for illustrating execution of a slew rate adjustment 1.
Figure 14:
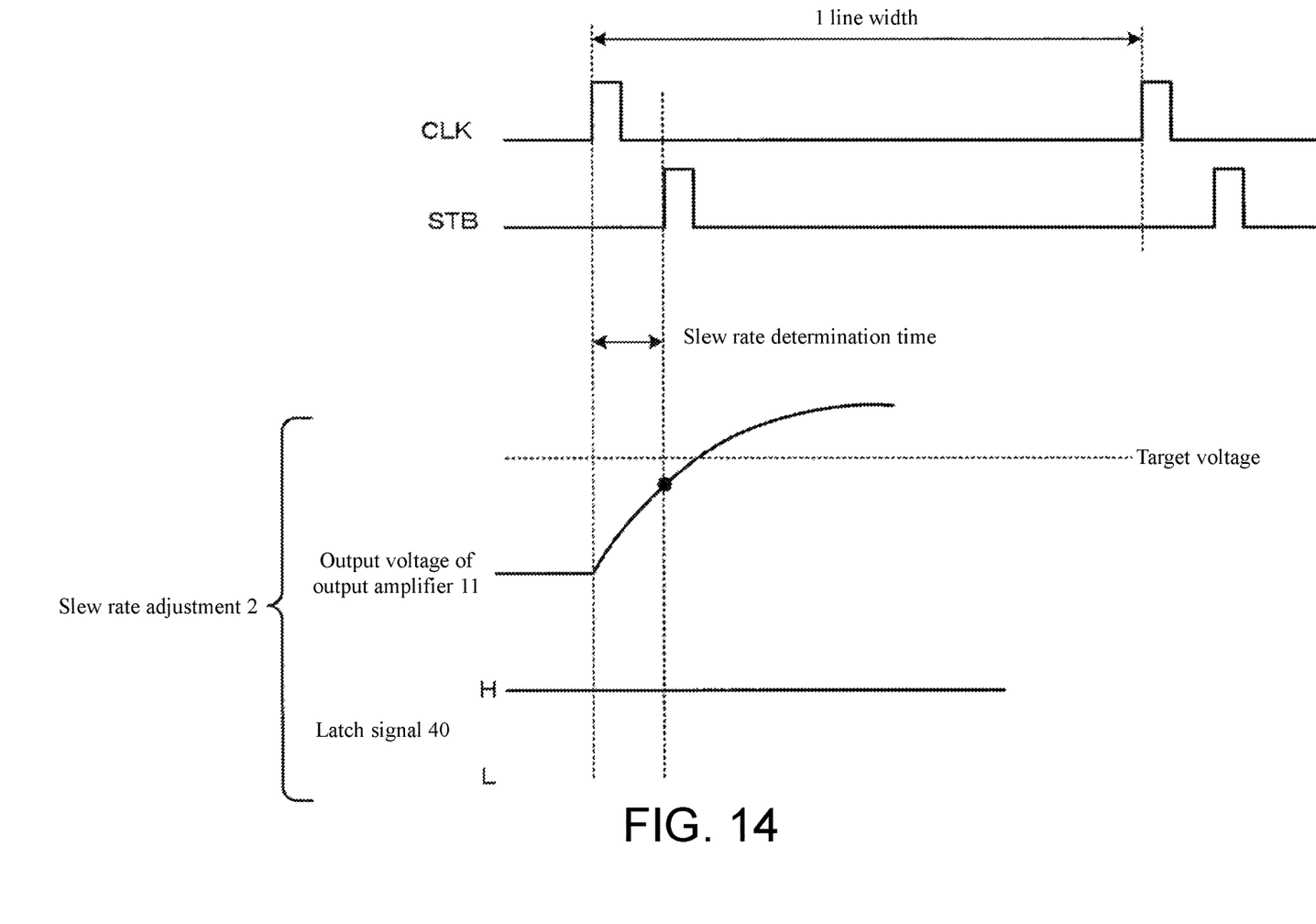
FIG. 14 is a diagram for illustrating execution of a slew rate adjustment 2.
Figure 15:
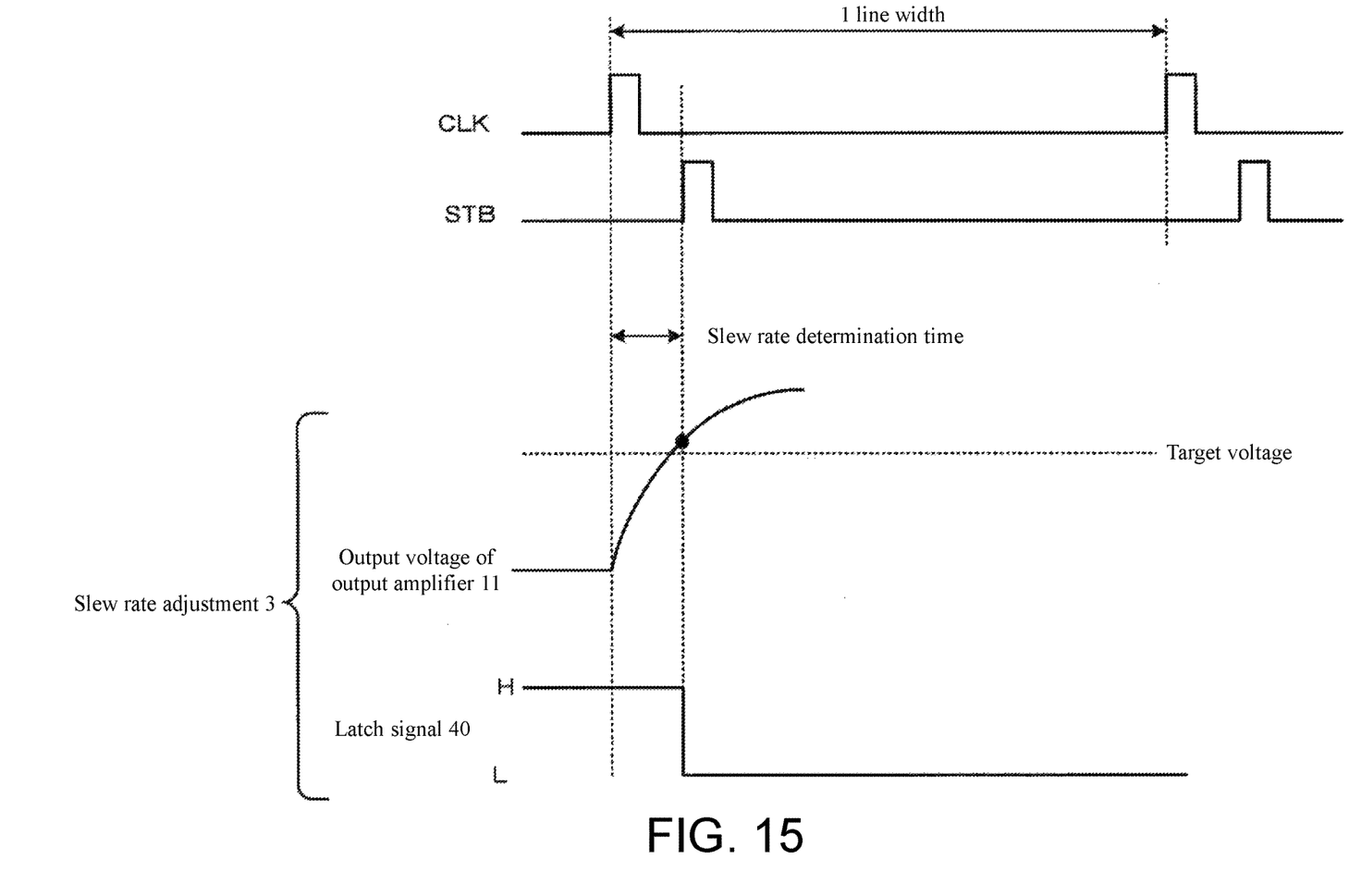
FIG. 15 is a diagram for illustrating execution of a slew rate adjustment 3.

FIG. 13 to FIG. 15 show sequential execution of slew rate adjustments 1, 2, 3, etc. during the V blank period.

First, FIG. 13 shows execution of the slew rate adjustment 1. In this slew rate adjustment 1, because the output voltage of the output amplifier 11 at the time when the standby signal STB is outputted has not reached the target voltage, the latch signal 40 outputted from the comparator 31 remains at the H level.

Next, FIG. 14 shows the slew rate adjustment 2 to be performed next. In this slew rate adjustment 2, due to the change in the trimming code, the slew rate after the change is higher than in the case of the slew rate adjustment 1. However, since the output voltage of the output amplifier 11 at the time when the standby signal STB is outputted has not yet reached the target voltage, the latch signal 40 outputted from the comparator 31 remains at the H level.

Then, FIG. 15 shows the slew rate adjustment 3 to be performed next. In this slew rate adjustment 3, due to the change in the trimming code, the slew rate after the change is even higher than in the case of the slew rate adjustment 2. Thus, since the output voltage of the output amplifier 11 at the time when the standby signal STB is outputted is larger than the target voltage, the latch signal 40 outputted from the comparator 31 changes from the H level to the L level.

As a result, the trimming code at the time of the slew rate adjustment 3 is newly held in the code latch part 34.

In this manner, in the driver IC 10A according to this embodiment, slew rate adjustment is regularly performed during the V blank period in the normal operation. Thus, according to the driver IC 10A of this embodiment, even if characteristics of the output amplifier 11 change due to aging or other factors, slew rate adjustment is permanently performed and the slew rate converges within the predetermined range.

What is claimed is:

1. A driver circuit comprising:
   an output amplifier that outputs an output signal for driving a liquid crystal display panel;
   a bias setting circuit that sets a bias level of the output amplifier;
   an automatic setting circuit that outputs a trimming code; and
   an adjustment circuit that changes a resistance value based on the trimming code inputted from the automatic setting circuit to change the bias level of the bias setting circuit and adjust a slew rate of the output amplifier,
   in an adjustment mode, the automatic setting circuit sequentially changes the trimming code outputted to the adjustment circuit and stores a trimming code with which a voltage value of the output signal after a preset time has elapsed from input of an input signal to the output amplifier becomes a target voltage set in advance, and, in a normal operation mode, outputs the stored trimming code to the adjustment circuit, wherein the automatic setting circuit comprises a comparator that compares, with a voltage value of the target voltage set in advance, the voltage value of the output signal after the preset time has elapsed from input of the input signal to the output amplifier, and the automatic setting circuit stores a trimming code of a time when output of the comparator becomes a logic indicating that the two voltage values match.

2. The driver circuit according to claim 1, wherein the automatic setting circuit turns into the adjustment mode during a vertical blanking interval in the output signal for driving the liquid crystal display panel, and updates the stored trimming code to a trimming code with which the slew rate falls within a target range set in advance.

3. The driver circuit according to claim 1, wherein the adjustment circuit comprises:
   a plurality of resistor elements that have resistance values different from each other and each have one terminal connected to the bias setting circuit;
   a plurality of switch elements that are connected between other terminals of the plurality of resistor elements and ground; and
   a selector that controls on or off of each of the plurality of switch elements.

* * * * *